(12) United States Patent
Catabay et al.

(10) Patent No.: US 6,528,423 B1
(45) Date of Patent: Mar. 4, 2003

(54) PROCESS FOR FORMING COMPOSITE OF BARRIER LAYERS OF DIELECTRIC MATERIAL TO INHIBIT MIGRATION OF COPPER FROM COPPER METAL INTERCONNECT OF INTEGRATED CIRCUIT STRUCTURE INTO ADJACENT LAYER OF LOW K DIELECTRIC MATERIAL

(75) Inventors: Wilbur G. Catabay, Saratoga, CA (US); Wei-Jen Hsia, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 46 days.

(21) Appl. No.: 10/002,831

(22) Filed: Oct. 26, 2001

(51) Int. Cl.[7] ...................... H01L 21/44; H01L 21/302; H01L 21/461
(52) U.S. Cl. ...................... 438/687; 438/691; 438/692; 438/693
(58) Field of Search .................................. 438/687, 623, 438/723, 724, 631, 691, 692, 693, 627

(56) References Cited

U.S. PATENT DOCUMENTS

| 3,012,861 A | 12/1961 | Ling |
| 3,178,392 A | 4/1965 | Kriner |

(List continued on next page.)

FOREIGN PATENT DOCUMENTS

| EP | 1176226 | * | 2/2001 | ......... | H01L/21/768 |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

(List continued on next page.)

*Primary Examiner*—John F. Niebling
*Assistant Examiner*—Walter L. Lindsay, Jr.
(74) *Attorney, Agent, or Firm*—John P. Taylor

(57) ABSTRACT

A process for forming an integrated circuit structure characterized by formation of an improved barrier layer for protection against migration of copper from a copper-containing layer into low k dielectric material while mitigating undesired increase in dielectric constant and mitigating undesirable interference by materials in the barrier layer with subsequent photolithography. The steps of the process comprise: forming a copper-containing layer over an integrated circuit structure; forming a first barrier layer of silicon carbide over the copper-containing layer; exposing the first layer of silicon carbide to a plasma to insert, into the first barrier layer of silicon carbide, ions capable of enhancing the ability of the silicon carbide barrier layer to prevent diffusion of copper from the copper-containing layer through the silicon carbide barrier layer; and sequentially repeating the steps of forming a barrier layer and exposing the barrier layer to plasma for from 1 to 5 additional times to form a composite layer of silicon carbide layers, each (with the possible exception of the top layer) exposed to the plasma. Preferably, the plasma comprises ions of elements and compounds selected from the group consisting of $O_2$, $H_2$, $CO_2$, He, Ar, $NH_3$, $N_2$, and combinations of such gases.

16 Claims, 4 Drawing Sheets

U.S. PATENT DOCUMENTS

| | | | |
|---|---|---|---|
| 3,832,202 | A | 8/1974 | Ritchie |
| 3,920,865 | A | 11/1975 | Laufer et al. |
| 4,705,725 | A | 11/1987 | Glajch |
| 4,771,328 | A | 9/1988 | Malaviya |
| 5,103,285 | A * | 4/1992 | Furumura et al. .......... 257/382 |
| 5,194,333 | A | 3/1993 | Ohnaka |
| 5,314,845 | A | 5/1994 | Lee |
| 5,364,800 | A | 11/1994 | Joyner |
| 5,376,595 | A | 12/1994 | Zupancic |
| 5,470,801 | A | 11/1995 | Kapoor et al. |
| 5,559,367 | A | 9/1996 | Cohen |
| 5,675,187 | A | 10/1997 | Numata |
| 5,688,724 | A | 11/1997 | Yoon |
| 5,818,071 | A * | 10/1998 | Loboda et al. ................ 257/55 |
| 5,847,461 | A | 12/1998 | Xu |
| 5,858,879 | A | 1/1999 | Chao |
| 5,864,172 | A | 1/1999 | Kapoor et al. |
| 5,874,367 | A | 2/1999 | Dobson |
| 5,874,745 | A | 2/1999 | Kuo |
| 5,882,489 | A | 3/1999 | Bersin |
| 5,904,154 | A | 5/1999 | Chien |
| 5,915,203 | A | 6/1999 | Sengupta |
| 5,930,655 | A * | 7/1999 | Cooney et al. ............. 438/474 |
| 5,939,763 | A | 8/1999 | Hao |
| 5,989,998 | A | 11/1999 | Sugahara et al. |
| 6,025,263 | A | 2/2000 | Tsai |
| 6,028,015 | A | 2/2000 | Wang et al. |
| 6,037,248 | A | 3/2000 | Ahn |
| 6,043,145 | A | 3/2000 | Suzuki et al. |
| 6,043,167 | A | 3/2000 | Lee |
| 6,051,477 | A | 4/2000 | Nam |
| 6,054,379 | A | 4/2000 | Yau |
| 6,063,702 | A | 5/2000 | Chung |
| 6,066,574 | A | 5/2000 | You |
| 6,114,259 | A * | 9/2000 | Sukharev et al. ........... 438/623 |
| 6,147,012 | A | 11/2000 | Sukharev et al. |
| 6,177,302 | B1 | 1/2001 | Yamazaki |
| 6,204,192 | B1 * | 3/2001 | Zhao et al. ................. 438/723 |
| 6,215,087 | B1 | 4/2001 | Akahori et al. |
| 6,232,658 | B1 | 5/2001 | Catabay et al. |
| 6,303,047 | B1 | 5/2001 | Catabay et al. |
| 6,245,666 | B1 | 6/2001 | Ko |
| 6,410,419 | B1 * | 6/2002 | Merchant et al. ........... 438/628 |

OTHER PUBLICATIONS

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

PROCESS FOR FORMING COMPOSITE OF BARRIER LAYERS OF DIELECTRIC MATERIAL TO INHIBIT MIGRATION OF COPPER FROM COPPER METAL INTERCONNECT OF INTEGRATED CIRCUIT STRUCTURE INTO ADJACENT LAYER OF LOW K DIELECTRIC MATERIAL

BACKGROUND OF THE INVENTION

1. Field of the Invention

This invention relates to the formation of integrated circuit structures. More particularly, this invention relates to a process for forming an improved composite barrier layer of dielectric. material for inhibiting migration of copper from a layer of copper interconnects of an integrated circuit structure into a low k dielectric layer.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric-constant to thereby lower the capacitance.

The above-mentioned shrinking of integrated circuits and the concurrent ever increasing demands for faster speeds, has also resulted in renewed interest in the use of copper as a filler material for vias and contact openings instead of tungsten, as well as for use in metal lines or interconnects instead of aluminum because of the well known low electrical resistance of copper, compared to either aluminum or tungsten.

However, there are negative aspects to the choice of copper for via filling or in the formation metal interconnects. Copper from such copper filler material is known to migrate into adjacent dielectric material unless a barrier layer is placed between the copper and the dielectric material. While a layer of silicon nitride formed between the copper and a dielectric layer has been found to provide a satisfactory barrier layer, the dielectric constant of silicon nitride is greater than 7. When, as discussed above, it is desirable to reduce undesirable capacitance by reducing the dielectric constant of the dielectric layer to a value below 4, the addition of a barrier layer having a dielectric constant over 7 is counter-productive to the desired reduction in capacitance of the dielectric material separating such copper lines or interconnects.

It is known to substitute for such a silicon nitride barrier layer, a barrier layer of silicon carbide doped with nitrogen, since silicon carbide has a dielectric constant less than 5. However, the nitrogen dopant in such a silicon carbide barrier layer interacts with photoresist causing poor resolution or no resolution as in the trench lithography for dual damascene structures. This is also known as resist poisoning or mushrooming for first via dual damascene schemes.

It would, therefore, be desirable to provide a barrier layer of dielectric material capable of preventing copper migration wherein such a barrier layer would have a dielectric constant below that of silicon nitride, yet have reduced tendency to interfere with subsequent photolithography resulting in photoresist poisoning than a conventional barrier layer comprising nitrogen-doped silicon carbide.

SUMMARY OF THE INVENTION

A process for forming an integrated circuit structure characterized by an improved composite barrier layer of dielectric material for protection against migration of copper from a copper-containing layer into adjacent low k dielectric material while mitigating undesired increases in dielectric constant and mitigating undesirable interference by materials in the barrier layer with subsequent photolithography. The process comprises: forming a copper-containing layer over an integrated circuit structure; forming a first barrier layer of silicon carbide over the copper-containing layer; exposing the first layer of silicon carbide to a plasma to insert, into the first barrier layer of silicon carbide, ions capable of enhancing the ability of the silicon carbide barrier layer to prevent diffusion of copper from the copper-containing layer through the silicon carbide barrier layer; and sequentially repeating the steps of forming a barrier layer and exposing the barrier layer to plasma for from 1 to 5 additional times to form a composite layer of silicon carbide layers, each (with the possible exception of the top layer) containing dopant from the plasma. Preferably, the plasma comprises ions of elements and compounds selected from the group consisting of $O_2$, $H_2$, $CO_2$, He, Ar, $NH_3$, $N_2$, and combinations of such gases.

DETAILED DESCRIPTION OF THE INVENTION

Figure 1:
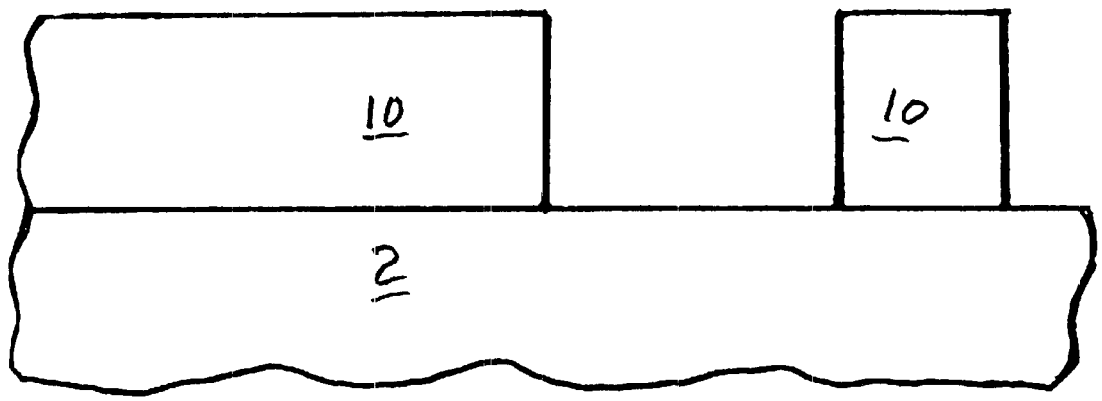
FIG. 1 is a fragmentary vertical cross-sectional view of an integrated circuit structure having a layer of copper metal interconnects formed thereon.

The invention comprises a process for forming an integrated circuit structure characterized by formation of an improved barrier layer for protection against migration of copper from a copper-containing layer into low k dielectric material while mitigating undesired increase in dielectric constant and mitigating undesirable interference by materials in the barrier layer with subsequent photolithography. The steps of the process comprise: forming a copper-containing layer over an integrated circuit structure; forming a first barrier layer of silicon carbide over the copper-containing layer; exposing the first layer of silicon carbide to a plasma to insert, into the first barrier layer of silicon carbide, ions capable of enhancing the ability of the silicon carbide barrier layer to prevent diffusion of copper from the copper-containing layer through the silicon carbide barrier layer; and sequentially repeating the steps of forming a barrier layer and exposing the barrier layer to plasma for from 1 to 5 additional times to form a composite layer of silicon carbide layers, each (with the possible exception of the top layer) exposed to the plasma. Preferably, the plasma comprises ions of elements and compounds selected from the group consisting of $O_2$, $H_2$, $CO_2$, He, Ar, $NH_3$, $N_2$, and combinations of such gases.

The barrier layers used to separate the copper metal from the low k dielectric material comprises a dielectric material selected for its ability to prevent migration of copper atoms through the barrier layer into the low k dielectric material. The barrier layer should also be a material capable of being treated with a plasma to dope the barrier layer with a non-reactive material capable of further enhancing the ability of the barrier layer to block migration of copper through the barrier layer. Preferably the barrier layer will have a dielectric constant of 5 or less to lessen the impact of the barrier layer on the overall dielectric constant of the layers separating the copper metal interconnects from each other as well as from the next layer of conductive material. In a preferred embodiment the barrier layers are constructed using silicon carbide having a dielectric constant not exceeding 5.

The thickness of each layer of barrier material should be at least about 8 nanometers (nm) to ensure blockage of the copper therethrough and to provide a sufficiently thick layer to accept dopant from the plasma treatment to further enhance the ability of the barrier material to block migration of copper through the barrier layer. To avoid excessive and unnecessary bulk, and adverse effects on the overall dielectric constant of the structure, each barrier layer should not exceed about 15 nm in thickness. The total number of layers of barrier material should range from at least 2 layers up to about 6 layers, although more layers could be used depending on the thickness of each barrier layer. Preferably, the number of barrier layers in the composite barrier layer will range from 3 to 5 layers, and typically will be 4 layers. Each barrier layer of the composite may be formed by any convenient method such as, for example, by CVD, PECVD, or PVD.

The plasma treatment of each individual layer of barrier material as it is formed is carried out in a plasma reactor using a plasma of non-reactive elements or compounds such as, for example, a plasma Of $O_2$, $H_2$, $CO_2$, He, Ar, $NH_3$, $N_2$, and combinations of such gases. The plasma power used may range from about 200 watts to about 1000 watts and will be somewhat dependent upon the size of the substrate being treated as well as the thickness of the individual barrier layer.

The pressure in the plasma reactor during the treatment will be maintained in a range of from about 1 torr to about 9 torr, while the substrate temperature should be maintained within a range of from about 200° C. to about 400° C. The treatment should be carried out for a period ranging from about 10 seconds to about 60 seconds.

Optionally, during the treatment of the sillicon carbide layers, a separate (second) rf bias may be applied directly to the substrate if needed. However, since the thickness of each silicon carbide layer in the composite is very small, the additional bias should not be large enough to cause penetration of the dopant through the layer into the underlying layer. When such a separate bias is applied to the substrate, the power level of such a second rf source should not exceed about 500 watts.

While we do not intend to be bound by any theories of how or why the composite of individually treated barrier layers formed by the process of the invention functions in a superior manner both with regard to blockage of copper migration as well as mitigation of any adverse effects on subsequent photolithography, it is postulated that the individual plasma treatment of each separate layer of barrier material results in enhanced detention of the dopant agent such as nitrogen in each barrier layer of dielectric material. This superior detention of dopant, in turn, both enhances the ability of the composite barrier layer to block migration of the copper therethrough, but also inhibits any adverse effects on subsequent photolithography, due to the reduction or absence of free dopant.

With regard to the absence or reduction of surface dopant in the composite barrier layer to interfere with subsequent photolithography, it should be noted that in one embodiment, the last or most upward layer of barrier material in the composite may have its plasma treatment either eliminated or abbreviated to further lessen the amount of dopant on the surface of the composite barrier layer which might unfavorably interfere with subsequent photolithography.

Turning now to the drawings, the process of the invention will be further illustrated. FIG. 1 shows several copper lines or interconnects 10 formed over an integrated circuit structure 2. While conventionally, a dielectric layer could be formed directly over a layer of aluminum interconnects, the presence of copper metal, as well as the use of low k dielectric material as the main dielectric layer separating the copper interconnects from the next layer of electrically conductive material, make it required that a barrier material be used to separate the copper metal from the low k dielectric material.

Figure 2:
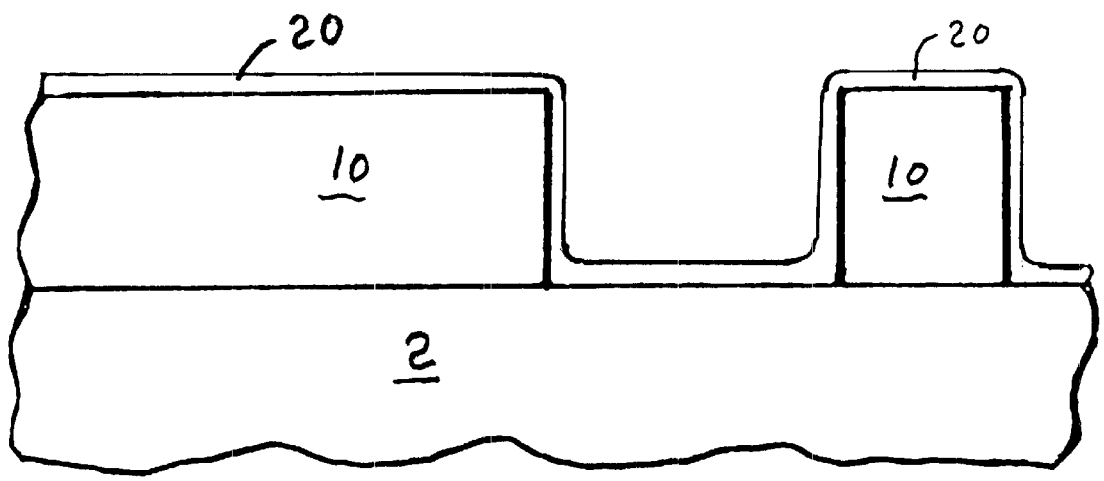
FIG. 2 is a fragmentary vertical cross-sectional view of the structure of FIG. 1 having a first barrier layer of silicon carbide dielectric material formed thereon which is then exposed to a plasma.

FIG. 2 illustrates the formation of the first thin layer of barrier material 20 of the composite barrier over copper interconnects 10 in accordance with the invention. It should be noted that the oversized thickness of barrier layer 20 (as well as the subsequent barrier layers which will be shown in FIGS. 3–5) is for illustrative purposes only. As discussed above the thickness of each of the individual barrier layers of dielectric material in the composite will range in thickness from at least about 8 nm to not more than about 15 nm. After formation of silicon carbide barrier layer 20, the structure is exposed to the previously described plasma to dope the silicon carbide with a dopant which will enhance the ability of the silicon carbide barrier to inhibit migration of copper therethrough. Preferably the same chamber in which the barrier layer is formed over the integrated circuit structure is also used for the plasma treatment to avoid extra movement of the substrate. If this is not possible or feasible, it would still be preferred if the deposition of the barrier layer and its subsequent plasma treatment could be carried out in separate chambers in the same apparatus or tool.

Figure 3:
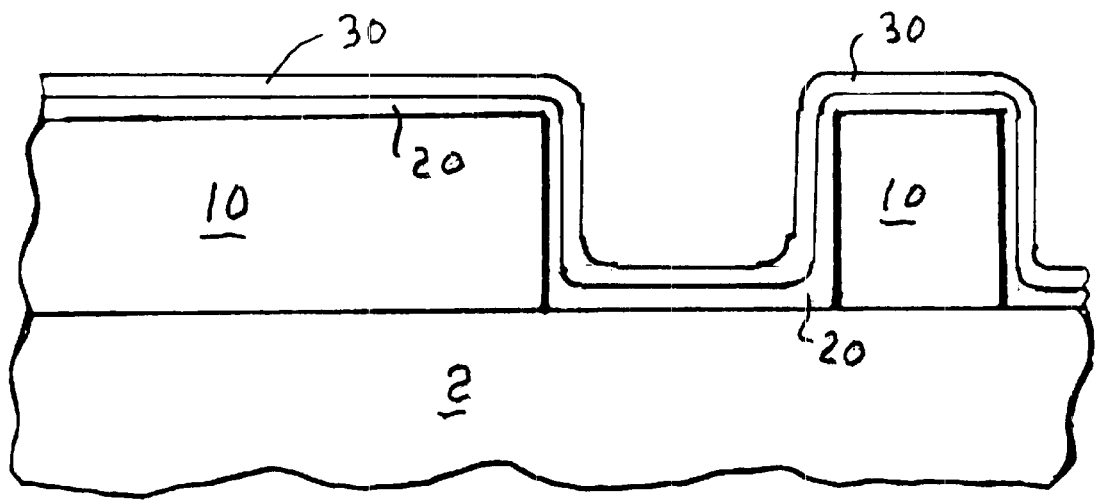
FIG. 3 is a fragmentary vertical cross-sectional view of the structure of FIG. 2 with a second barrier layer of silicon carbide dielectric material formed over the first barrier layer which second barrier layer is then also exposed to a plasma.

As seen in FIG. 3, after silicon carbide barrier layer 20 has been deposited and plasma treated, a second barrier layer of silicon carbide 30 is formed over plasma treated barrier layer 20 and within the same range of thickness. Second barrier layer 30 is then also subjected to the same plasma treatment to dope barrier layer 30 with the same dopant used to dope barrier layer 20.

Figure 4:
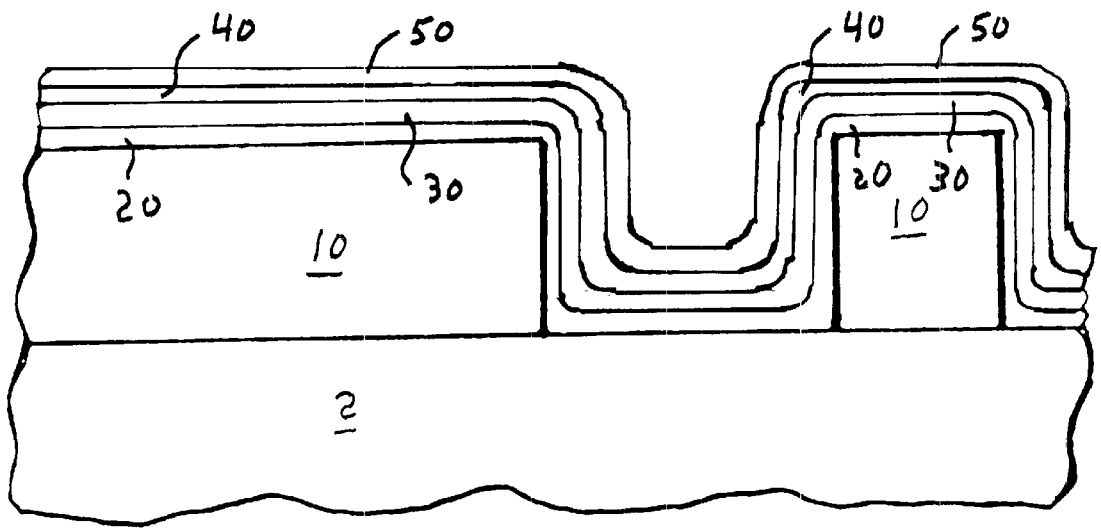
FIG. 4 is a fragmentary vertical cross-sectional view of the structure of FIG. 3 after two additional barrier layers of silicon carbide dielectric material have been formed over the second barrier layer, with each barrier layer separately exposed to a plasma before formation of the next barrier layer.

FIG. 4 illustrates the structure after a third barrier layer 40 has been formed over doped barrier layer 30 and then plasma treated in the same manner as barrier layers 20 and 30 to dope barrier layer 40 in the same manner. A fourth barrier layer 50 is then shown as formed over third barrier layer 40. Plasma treatment of barrier layer 50, when layer 50 comprises the top layer of the composite of barrier layers, may be optionally omitted, if desired, to further inhibit migration of dopant from the composite of doped barrier layers to further ensure that the dopant in the composite of barrier layers does not interfere with subsequent photolithography. Otherwise, if layer 50 is also treated with plasma, the same treatment parameters should be generally adhered to as in the treatment of barrier layers 20, 30, and 40, although the amount of dopant inserted into top barrier layer 50 may be less than the amount of dopant in barrier layers 20, 30, and 40.

Figure 5:
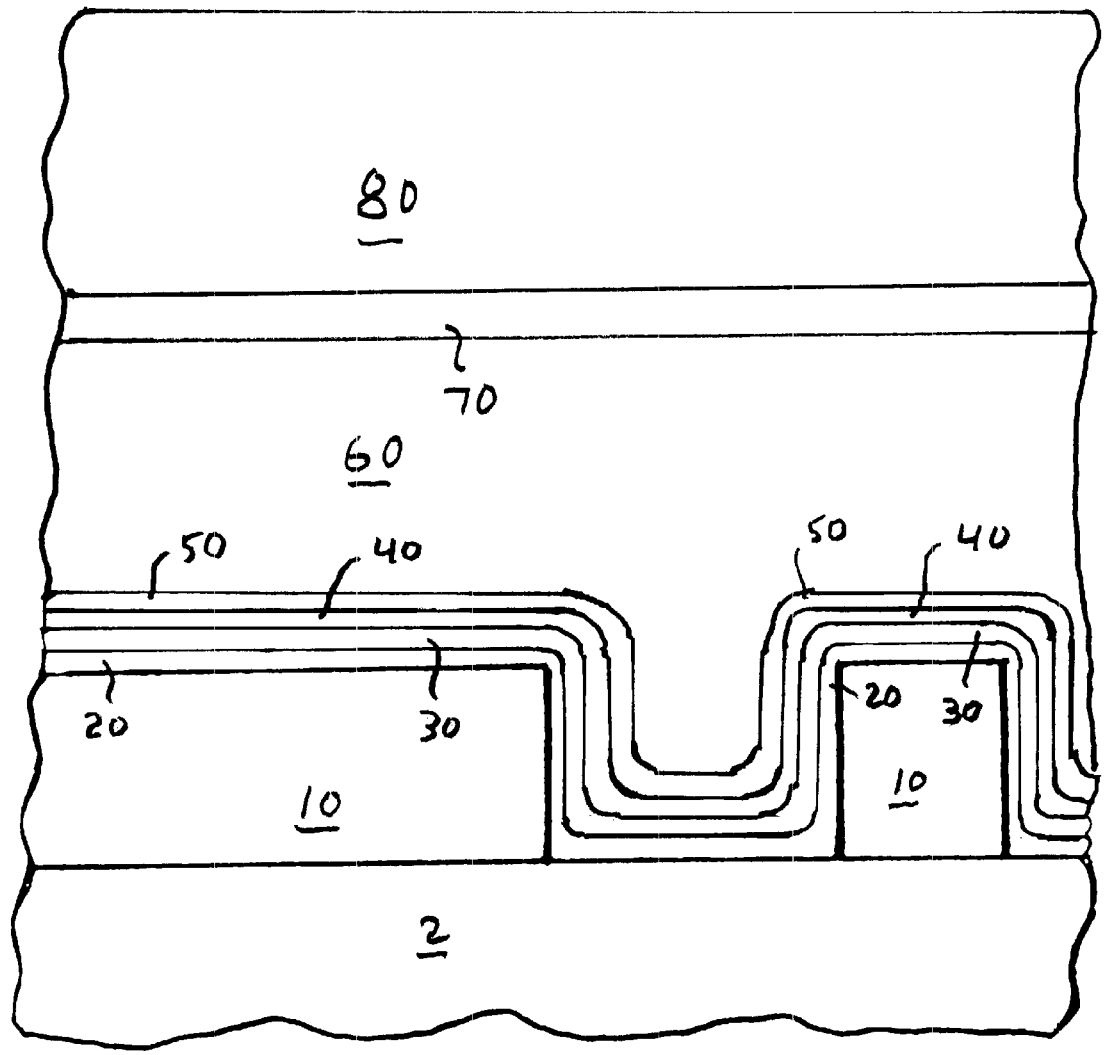
FIG. 5 is a fragmentary vertical cross-sectional view of the structure of FIG. 4 having a first layer of low k dielectric material formed over the composite of barrier layers, an etch stop layer formed over the first layer of low k dielectric material and a second layer of low k dielectric material formed over the etch stop layer.
Figure 6:
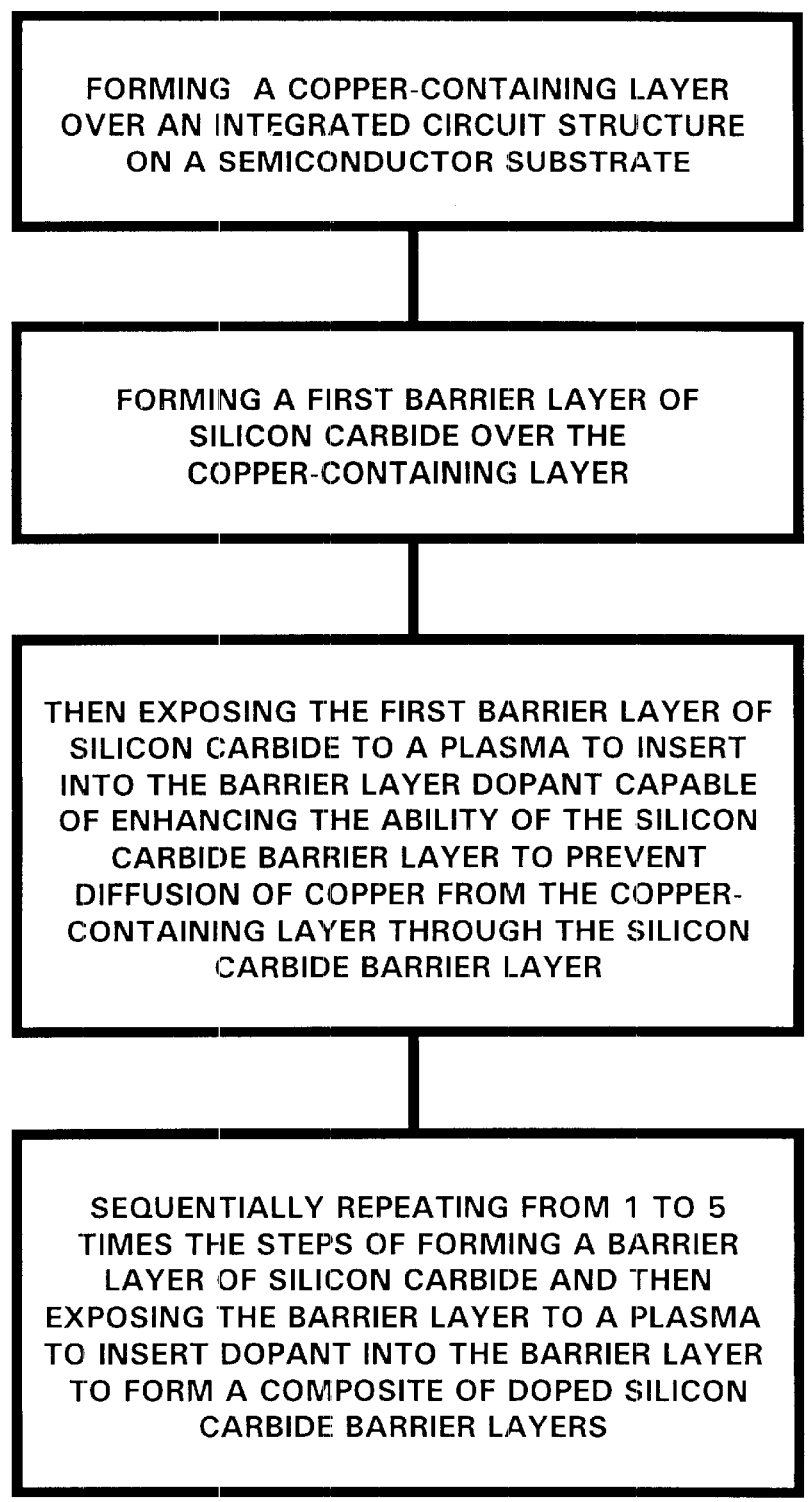
FIG. 6 is a flow sheet illustrating the process of the invention.

FIG. 5 depicts the same composite of barrier layers thereon as shown in FIG. 4, but with the addition of first low k dielectric layer 60 over the composite of barrier layers 20, 30, 40, and 50, an etch stop layer 70 formed over first low k dielectric layer 60, and a second low k dielectric layer 80 formed over etch stop layer 70. First low k dielectric layer 60, etch stop layer 70, and second low k dielectric layer 80 are used in the dual damascene formation of vias and trenches to be filled with copper filler metal, as is well known to those skilled in the art.

Low k dielectric layers 60 and 80 may comprise any commercially available low k dielectric material such as, for example, carbon-doped low k silicon oxide dielectric material available as Coral from Novellus, Black Diamond from Applied Materials, and Orion from Trikon, as well as spin-on low k dielectric materials such as XLK from Dow-Corning; LKD from JSR; and SiLK from Dow Chemical. Other low k silicon oxide dielectric material include the reaction product of a carbon doped silane and hydrogen peroxide available from Trikon as Flowfil, or the low k dielectric materials described in described in copending application Ser. No. 09/274,457, filed Mar. 22, 1999 and assigned to the assignee of this invention, the subject matter of which is hereby is incorporated by reference. The low k carbon-doped silicon oxide dielectric material might also comprise the reaction product of an oxidizing agent and an organofluoro silane such as described in Ser. No. 09/590, 310, filed on Jun. 7, 2000; and in Ser. Nos. 09/792,683; 09/792,685; and 09/792,66691; all filed on Feb. 23, 2001. All four of these later applications are also assigned to the assignee of this application, and the subject matter of all these four applications is also hereby incorporated by reference.

Etch stop layer 70 positioned between layers 60 and 80 of low k dielectric material preferably comprises a dielectric material having different etch characteristics than layers 60 and 80 of low k dielectric material. For example, when low k dielectric layers 60 and 80 comprise a silicon oxide-based -dielectric material, etch stop layer 70 may comprise silicon nitride or silicon carbide. After formation of the desired pattern of vias by etching through all three layers (60, 70, and 80), etch stop layer 70 is used as an etch stop during subsequent etching of second low k dielectric layer 80 to form a pattern of trenches therein.

It should be noted, in this regard, that the composite of plasma-treated silicon carbide barrier layers formed by the process of the invention may also function as an etch stop layer to protect the underlying integrated circuit structure during the initial etching of the pattern of vias through both low k dielectric layers 60 and 80, as well as through etch stop layer 70. In this regard, the presence of a composite of silicon carbide barrier layers beneath first law k dielectric layer 60 may influence the choice of materials to be used for formation of etch stop layer 70.

Thus the invention provides a process for forming a composite of individually doped silicon carbide barrier layers to protect subsequent low k dielectric layers from migration of copper atoms into the low k dielectric material without, however, interfering with subsequent photolithography which could result in photoresist poisoning.

Having thus described the invention what is claimed is:

1. A process for forming an integrated circuit structure on a semiconductor substrate characterized by formation of an improved composite barrier layer of dielectric material for protection against migration of metal ions from a metal-containing layer into low k dielectric material while mitigating undesired increase in dielectric constant and mitigating undesirable interaction between the barrier layer and photoresist material which comprises:
    a) forming a copper-containing layer over an integrated circuit structure;
    b) forming a first barrier layer of silicon carbide over said copper-containing layer;
    c) exposing said first layer of silicon carbide to a plasma to insert, into said first barrier layer of silicon carbide, dopant capable of enhancing the ability of said, silicon carbide barrier layer to prevent diffusion of copper from said copper-containing layer through said silicon carbide barrier layer; and
    d) sequentially repeating steps b and c for from 1 to 5 additional times to form a composite barrier layer of silicon carbide layers, each exposed to said plasma.

2. The process of claim 1 wherein said plasma comprises ions of elements and compounds selected from the group consisting of $O_2$, $H_2$, $CO_2$, He, Ar, $NH_3$, $N_2$, and combinations of such gases.

3. The process of claim 1 wherein said step of forming a copper-containing layer over an integrated circuit structure further comprises forming a layer of copper interconnects over an integrated circuit structure.

4. The process of claim 1 wherein said step of forming a first barrier layer of silicon carbide over said copper-containing layer further comprises forming a layer of silicon carbide ranging in thickness from about 8 nm to about 15 nm.

5. The process of claim 4 wherein said step of sequentially repeating the step of forming a barrier layer further includes forming such barrier layers to a thickness within the same range as said first barrier layer.

6. The process of claim 1 wherein said plasma operates at a power which ranges from about 200 watts to about 1000 watts.

7. The process of claim 1 wherein said plasma treatment is carried out in a reactor maintained at a pressure of from about 1 torr to about 9 torr during said treatment.

8. The process of claim 1 wherein said plasma treatment is carried out while maintaining said semiconductor substrate within a temperature range of from about 200° C. to about 400° C.

9. The process of claim 1 wherein said plasma treatment is carried out for a time period ranging from about 10 seconds to about 60 seconds.

10. The process of claim 1 wherein said plasma treatment is carried out while maintaining, on said semiconductor substrate, a separate rf bias not exceeding 500 watts.

11. The process of claim 1 wherein the last silicon carbide barrier layer formed is not treated by said plasma to inhibit interference of dopant within said last barrier layer with subsequent photolithography.

12. A process for forming an integrated circuit structure on a semiconductor substrate characterized by formation of an improved composite barrier layer of dielectric material for protection against migration of metal ions from a metal-containing layer into low k dielectric material while mitigating undesired increase in dielectric constant and mitigating undesirable interaction between the barrier layer and photoresist material which comprises:

a) forming a layer of copper interconnects over an integrated circuit structure;

b) forming, over said layer of copper interconnects, a first barrier layer of silicon carbide ranging in thickness from about 8 nm to about 15 nm;

c) exposing said first layer of silicon carbide to a plasma comprising ions of elements and compounds selected from the group consisting of $O_2$, $H_2$, $CO_2$, He, Ar, $NH_3$, $N_2$, and combinations of such gases, to insert, into said first barrier layer of silicon carbide, ions capable of enhancing the ability of said silicon carbide barrier layer to prevent diffusion of copper from said layer of copper interconnects through said silicon carbide barrier layer; and d) sequentially repeating steps b and c for from 1 to 5 additional times to form a composite barrier layer of silicon carbide layers, each exposed to said plasma.

13. The process of claim 12 wherein said plasma treatment is carried out for a time period ranging from about 10 seconds to about 60 seconds at a plasma power which ranges from about 200 watts to about 1000 watts in a reactor maintained at a pressure of from about 1 torr to about 9 torr during said treatment while maintaining said semiconductor substrate within a temperature range of from about 200° C. to about 400° C.

14. The process of claim 12 wherein the last silicon carbide barrier layer formed is not treated by said plasma to inhibit interference of dopant within said last barrier layer with subsequent photolithography.

15. The process of claim 12 wherein steps b and c are sequentially repeated from 1 to 4 times.

16. The process of claim 12 wherein steps b and c are sequentially repeated from 2 to 3 times.

* * * * *